US012796350B2

(12) United States Patent
Ishibashi et al.

(10) Patent No.: US 12,796,350 B2
(45) Date of Patent: Nov. 10, 2026

(54) FILM FORMING METHOD AND SUBSTRATE PROCESSING APPARATUS

(71) Applicant: TOKYO ELECTRON LIMITED, Tokyo (JP)

(72) Inventors: Shota Ishibashi, Nirasaki City (KR); Toru Kitada, Nirasaki City (JP); Keiichi Nagasaka, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 335 days.

(21) Appl. No.: 18/565,486

(22) PCT Filed: Jun. 2, 2022

(86) PCT No.: PCT/JP2022/022549

§ 371 (c)(1),
(2) Date: Nov. 29, 2023

(87) PCT Pub. No.: WO2022/259960

PCT Pub. Date: Dec. 15, 2022

(65) Prior Publication Data

US 2024/0274436 A1 Aug. 15, 2024

(30) Foreign Application Priority Data

Jun. 9, 2021 (JP) ................................ 2021-096878

(51) Int. Cl.

| | |
|---|---|
| ***H10P 14/20*** | (2026.01) |
| ***C23C 14/02*** | (2006.01) |
| ***C23C 14/08*** | (2006.01) |
| ***C23C 14/34*** | (2006.01) |
| ***C23C 14/54*** | (2006.01) |
| ***H10D 30/67*** | (2025.01) |
| ***H10P 72/00*** | (2026.01) |

(52) U.S. Cl.

CPC .......... *H10P 14/3434* (2026.01); *C23C 14/02* (2013.01); *C23C 14/08* (2013.01); *C23C 14/34* (2013.01); *C23C 14/541* (2013.01); *H10D 30/6755* (2025.01); *H10P 14/36* (2026.01); *H10P 72/0432* (2026.01)

(58) Field of Classification Search

CPC ...... H10P 14/20; H10P 14/29; H10P 14/2914; H10P 14/3426; H10P 14/3434; H10P 14/12; H10P 14/22; H10D 30/67; H10D 30/6755; H10D 30/6756; C23C 14/08; C23C 14/086; C23C 14/02; C23C 14/34; C23C 14/54

See application file for complete search history.

(56) References Cited

U.S. PATENT DOCUMENTS

2010/0025677 A1* 2/2010 Yamazaki .......... H10D 30/6755 204/192.1

FOREIGN PATENT DOCUMENTS

JP 2012-074622 A 4/2012
JP 2012074622 * 4/2012

(Continued)

OTHER PUBLICATIONS

PCT International Search Report and Written Opinion, PCT Application No. PCT/JP2022/022549, Aug. 2, 2022, 8 pages (with English translation of PCT International Search Report).

*Primary Examiner* — Thanhha S Pham

(74) *Attorney, Agent, or Firm* — Fenwick & West LLP

(57) ABSTRACT

There is provided a film forming method comprising: cooling a substrate to an extremely low temperature of 200 K or lower; and forming an oxide semiconductor film on the cooled substrate.

4 Claims, 9 Drawing Sheets

(56) References Cited

FOREIGN PATENT DOCUMENTS

| | | | |
|---|---|---|---|
| JP | 2016-082135 | A | 5/2016 |
| JP | 2016-519429 | A | 6/2016 |
| WO | WO 2014/149682 | A1 | 9/2014 |
| WO | WO 2018-047977 | A1 | 3/2018 |

* cited by examiner

FILM FORMING METHOD AND SUBSTRATE PROCESSING APPARATUS

TECHNICAL FIELD

The present disclosure relates to a film forming method and a substrate processing apparatus.

BACKGROUND

Patent Document 1 discloses a thin film transistor including a gate electrode, a gate dielectric layer, an oxide semiconductor layer containing an indium-gallium-zinc oxide (IGZO), a source electrode, a drain electrode, a back channel protective layer, and an etching stop layer.

PRIOR ART DOCUMENTS

Patent Documents

Patent Document 1: Japanese Laid-open Patent Publication No. 2016-519429

SUMMARY

Problems to Be Resolved by the Invention

In a thin film transistor (TFT) using an IGZO film as an oxide semiconductor, a threshold voltage is shifted to a negative side due to oxygen vacancies in the IGZO film. By performing annealing as post-treatment after film formation, the threshold voltage can be shifted to a positive side. However, even after the annealing, the TFT is in an ON state at a gate voltage of 0V. Therefore, in the TFT using an IGZO film, a leakage current occurs at a gate voltage of 0V. Alternatively, the TFT using an IGZO film requires a gate voltage for turning off the TFT.

In one aspect, an object of the present disclosure is to provide a film forming method that suppress oxygen vacancies and a substrate processing apparatus.

Means for Solving the Problems

In order to solve the above-described drawback, in accordance with one aspect, there is provided a film forming method includes cooling a substrate to an extremely low temperature of 200 K or lower, and forming an oxide semiconductor film on the cooled substrate.

Effect of the Invention

In accordance with one aspect, it is possible to provide a film forming method that suppresses oxygen vacancies and a substrate processing apparatus.

DETAILED DESCRIPTION

Figure 1:
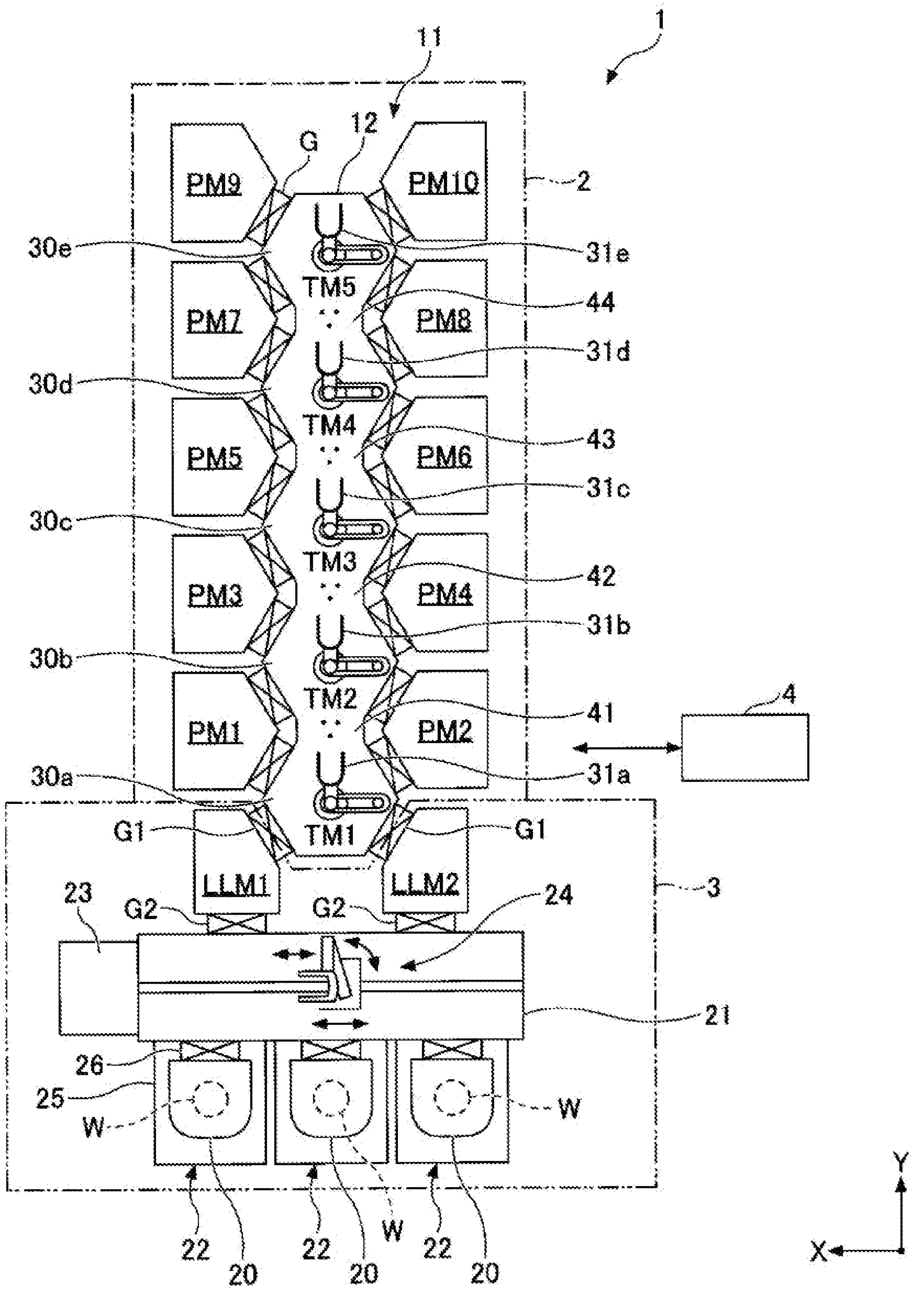
FIG. 1 is a schematic cross-sectional view of an example of a semiconductor manufacturing apparatus according to the present embodiment.

Hereinafter, embodiments of the present disclosure will be described with reference to the accompanying drawings. Like reference numerals will be given to substantially like parts throughout this specification and the drawings, and redundant description thereof will be omitted. Further, in order to facilitate understanding, the scale of each part in the drawings may be different from the actual scale.

Directions such as parallel, right-angled, orthogonal, horizontal, vertical, up and down, and left and right are allowed to deviate without spoiling the effect of the embodiment. The shape of a corner is not limited to a right angle and may be rounded in an arch shape. The terms parallel, right-angled, orthogonal, horizontal, and vertical may include substantially parallel, substantially right-angled, substantially orthogonal, substantially horizontal, and substantially vertical, respectively.

<Semiconductor Manufacturing Apparatus 1>

FIG. 1 is a schematic cross-sectional view of a semiconductor manufacturing apparatus 1, which is an example of a semiconductor manufacturing apparatus (substrate processing apparatus) according to the present embodiment. The semiconductor manufacturing apparatus 1 performs multiple processes (desired treatments such as etching, film formation, ashing, and the like) on a substrate W. The semiconductor manufacturing apparatus 1 includes a processing part 2, a loading/unloading part 3, and a controller 4. Although the substrate W is not particularly limited, the substrate W is a semiconductor wafer (hereinafter, simply referred to as "wafer"), for example.

The loading/unloading part 3 loads/unloads a substrate that is an example of the wafer into/from the processing part 2. The processing part 2 includes multiple (ten in the present embodiment) process modules PM1 to PM10 for performing desired vacuum processing on the wafer. The wafer is serially transferred (sequentially transferred) to the process modules PM1 to PM10 by a first transfer device 11.

The first transfer device 11 includes multiple transfer modules TM1 to TM5. The transfer modules TM1 to TM5 have containers 30*a*, 30*b*, 30*c*, 30*d*, and 30*e* having a hexagonal planar shape and maintained in a vacuum state, respectively. Further, the transfer modules TM1 to TM5 have multi-joint transfer mechanisms 31*a*, 31*b*, 31*c*, 31*d* and 31*e* disposed in the containers 30*a*, 30*b*, 30*c*, 30*d* and 30*e*, respectively.

Delivery parts 41, 42, 43 and 44 as transfer buffers are disposed between the transfer mechanism 31*a* of the transfer module TM1 and the transfer mechanism 31*b* of the transfer module TM2, between the transfer mechanism 31*b* of the transfer module TM2 and the transfer mechanism 31*c* of the transfer module TM3, between the transfer mechanism 31*c* of the transfer module TM3 and the transfer mechanism 31*d* of the transfer module TM4, between the transfer mechanism 31*d* of the transfer module TM4 and the transfer mechanism 31*e* of the transfer modules TM5, respectively. The containers 30*a*, 30*b*, 30*c*, 30*d* and 30*e* of the transfer modules TM1 to TM5 communicate with each other to form one transfer chamber 12.

The transfer chamber 12 extends in the Y direction in the drawing. Five of the process modules PM1 to PM10 are connected to one side of the transfer chamber 12 through gate valves G that can be opened and closed, and the other five process modules are connected to another side of the transfer chamber 12 through gate valves G that can be opened and closed. The gate valves G of the process modules PM1 to PM10 are opened when the transfer modules TM1 to TM5 access the process modules PM1 to PM10, and are closed during desired processing.

The loading/unloading part 3 is connected to one end of the processing part 2. The loading/unloading part 3 includes an atmospheric transfer chamber 21, three load ports 22, an aligner module 23, two load-lock modules LLM1 and LLM2, and a second transfer device 24. The load ports 22, the aligner module 23, and the load-lock modules LLM1 and LLM2 are connected to the atmospheric transfer chamber 21. Further, the second transfer device 24 is disposed in the atmospheric transfer chamber 21.

The atmospheric transfer chamber 21 has a rectangular parallelepiped shape with the X direction as a longitudinal direction in the drawing. The three load ports 22 are disposed at a long sidewall of the atmospheric transfer chamber 21 opposite to a sidewall facing the processing part 2. Each load port 22 has a placing table 25 and a transfer port 26. A front opening unified pod (FOUP) 20 that is a substrate storage container accommodating a plurality of wafers is placed on the placing table 25. The FOUP 20 on the placing table 25 is connected in a sealed state to the atmospheric transfer chamber 21 through the transfer port 26. The aligner module 23 is connected to one short sidewall of the atmospheric transfer chamber 21. The alignment of the wafer is performed in the aligner module 23.

The two load-lock modules LLM1 and LLM2 allow wafers to be transferred between the atmospheric transfer chamber 21 maintained at an atmospheric pressure and the transfer chamber 12 maintained at a vacuum atmosphere, and a pressure in each of the load-lock modules LLM1 and LLM2 is variable between an atmospheric pressure and a vacuum level similar to that in the transfer chamber 12. Each of the two load-lock modules LLM1 and LLM2 has two transfer ports. One of the two transfer ports is connected to the long sidewall of the atmospheric transfer chamber 21 facing the processing part 2 through a gate valve G2. The other transfer port is connected to the transfer chamber 12 of the processing part 2 through a gate valve G1.

The load-lock module LLM1 is used when the wafer is transferred from the loading/unloading part 3 to the processing part 2. The load-lock module LLM2 is used when the wafer is transferred from the processing part 2 to the loading/unloading part 3. Further, processing such as degassing or the like may be performed in the load-lock modules LLM1 and LLM2.

The second transfer device 24 in the atmospheric transfer chamber 21 has a multi-joint structure, and transfers wafers to the FOUP 20 on the load port 22, the aligner module 23, and the load-lock modules LLM1 and LLM2. Specifically, the second transfer device 24 takes out an unprocessed wafer from the FOUP 20 of the load port 22, and transfers the wafer W to the aligner module 23 and then from the aligner module 23 to the load-lock module LLM1. Further, the second transfer device 24 receives a processed wafer transferred from the processing part 2 to the load-lock module LLM2 and transfers the wafer to the FOUP 20 of the load port 22. Although FIG. 1 shows an example in which the second transfer device 24 has one pick for receiving a wafer, the second transfer device 24 may have two picks.

The first transfer device 11 and the second transfer device 24 constitute the transfer part of the semiconductor manufacturing apparatus 1. In the processing part 2, the process modules PM1, PM3, PM5, PM7 and PM9 are arranged on one side of the transfer chamber 12 in that order from the load-lock module LLM1 side. The process modules PM2, PM4, PM6, PM8, and PM10 are arranged on another side of the transfer chamber 12 in that order from the load-lock module LLM2 side. In the first transfer device 11, the transfer modules TM1, TM2, TM3, TM4, and TM5 are arranged in that order from the load-lock modules LLM1 and LLM2 side.

The transfer mechanism 31*a* of the transfer module TM1 is accessible to the load-lock modules LLM1 and LLM2, the process modules PM1 and PM2, and the delivery part 41. The transfer mechanism 31*b* of the transfer module TM2 is accessible to the process modules PM1, PM2, PM3, and PM4, and the delivery parts 41 and 42.

The transfer mechanism 31*c* of the transfer module TM3 is accessible to the process modules PM3, PM4, PM5, and PM6, and the delivery parts 42 and 43. The transfer mechanism 31*d* of the transfer module TM4 is accessible to the process modules PM5, PM6, PM7, and PM8, and the delivery parts 43 and 44. The transfer mechanism 31*e* of the transfer module TM5 is accessible to the process modules PM7, PM8, PM9, and PM10, and the delivery part 44.

Figure 2:
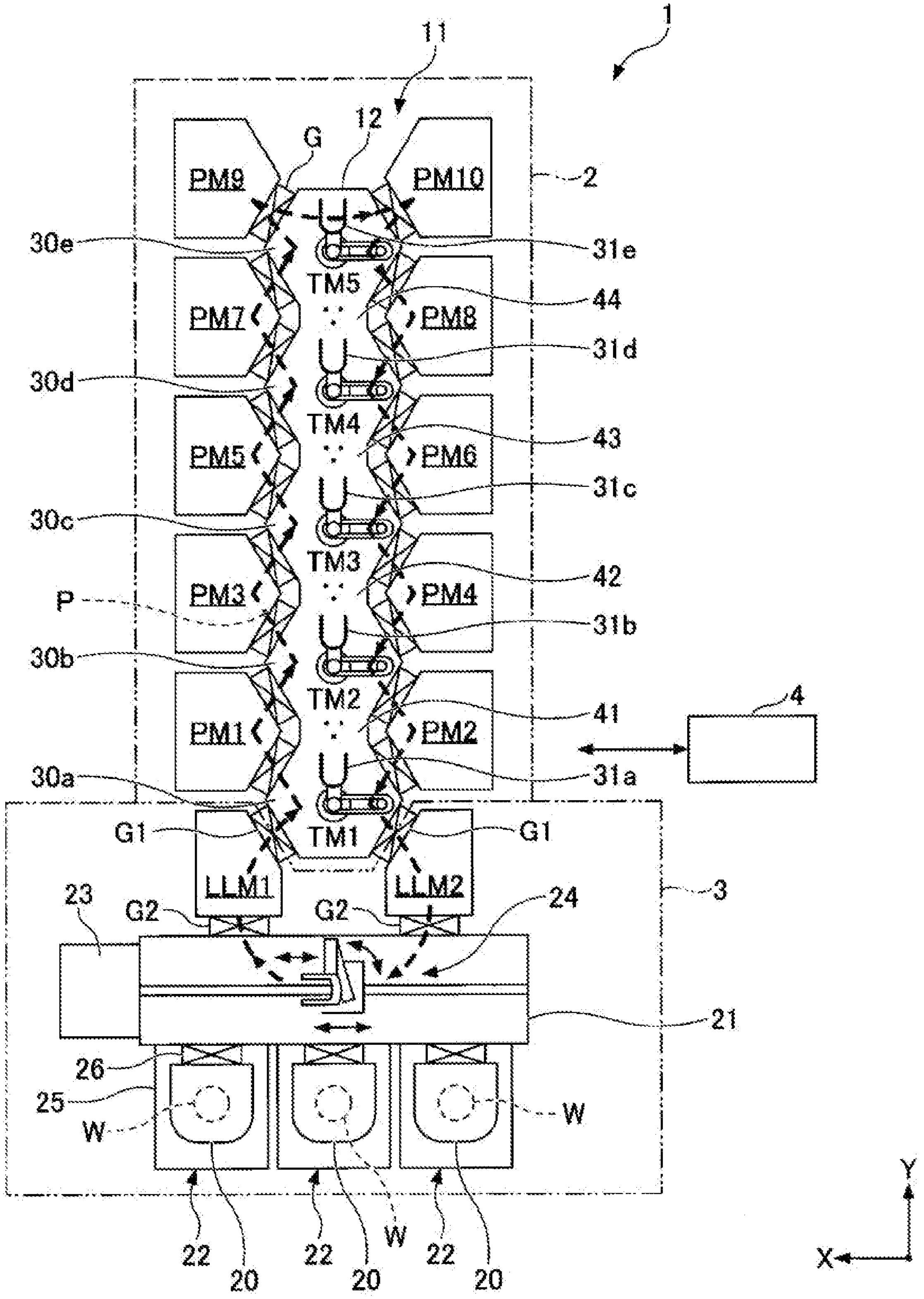
FIG. 2 is a schematic cross-sectional view showing an example of a wafer transfer path of the semiconductor manufacturing apparatus according to the present embodiment.

The second transfer device 24 and the transfer modules TM1 to TM5 of the first transfer device 11 are configured as shown in FIG. 1. Therefore, as shown in FIG. 2, the wafer taken out from the FOUP 20 is serially transferred in one direction along a substantially U-shaped path P in the processing part 2, processed in the respective process modules PM1 to PM10, and returned to the FOUP 20. In other words, the wafer is serially transferred in the order of the process modules PM1, PM3, PM5, PM7, PM9, PM10, PM8, PM6, PM4, and PM2, and subjected to desired processing.

The semiconductor manufacturing apparatus 1 can be used for forming a magnetroresistive tunnel junction (MTJ) film used in a magnetroresistive random access memory (MRAM), for example. The MTJ film is formed by a plurality of desired processes such as pre-cleaning, film formation, oxidation, heat treatment, cooling, and the like. The desired processes are performed in the process modules PM1 to PM10. At least one of the process modules PM1 to PM10 may be a standby module in which a wafer stands by.

The controller 4 controls individual components of the semiconductor manufacturing apparatus 1. The controller 4 controls, e.g., the transfer modules TM1 to TM5 (the transfer mechanisms 31*a* to 31*e*), the second transfer device 24, the process modules PM1 to PM10, the load-lock modules LLM1 and LLM2, the transfer chamber 12, and the gate valves G, G1, and G2. The controller 4 is a computer, for example.

<Substrate Processing Apparatus 5>

Figure 3:
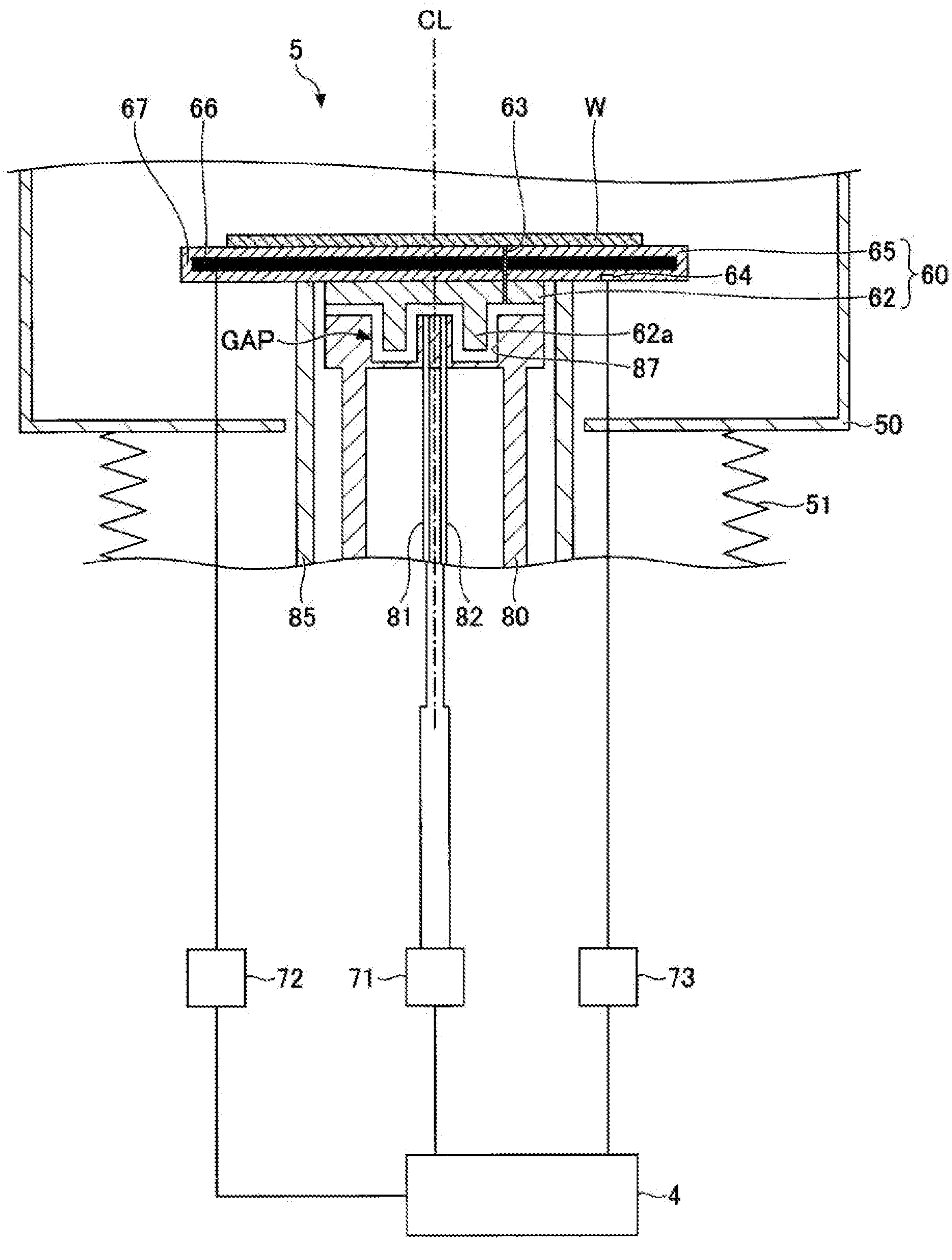
FIG. 3 is a schematic cross-sectional view of an example of a substrate processing apparatus of the semiconductor manufacturing apparatus according to the present embodiment.

Next, the substrate processing apparatus 5 used in any one of the process modules PM1 to PM10 will be described. FIG. 3 is a schematic cross-sectional view of a substrate processing apparatus 5 that is an example of a substrate processing apparatus of a semiconductor manufacturing apparatus according to the present embodiment. Here, the substrate processing apparatus 5 is an apparatus that cools the substrate W to an extremely low temperature of 200 K or lower.

The substrate processing apparatus 5 includes a placing table 60 on which the substrate W is placed in the processing chamber 50. The substrate processing apparatus 5 further includes a refrigeration medium 80. The substrate processing apparatus 5 further includes an outer cylinder 85 that supports the placing table 60.

The placing table 60 includes an electrostatic chuck 65 disposed at an upper side and on which the substrate W is placed, and a plate 62 disposed at a lower side. The electrostatic chuck 65 has a chuck electrode 66 embedded in a dielectric film 67. A predetermined potential is applied from a DC power supply 72 to the chuck electrode 66. The plate 62 is made of copper (Cu) having high thermal conductivity.

Since the placing table 60 includes the electrostatic chuck 65, the substrate W can be attracted by the electrostatic chuck 65 and fixed on the upper surface of the placing table 60. The placing table 60 does not necessarily have the laminated structure of the electrostatic chuck 65 and the plate 62. Instead, the placing table 60 may be a single plate, or may be integrally molded by sintering or the like.

Further, a through-hole 63 is formed in the placing table 60 to vertically penetrate the electrostatic chuck 65 and the plate 62. The through-hole 63 communicates with a gap GAP formed below the placing table 60. A coolant supplied to the gap GAP is supplied to the gap between the upper surface of the placing table 60 (the electrostatic chuck) and the bottom surface of the substrate W through the through-hole 63. The coolant is supplied to the gap between the upper surface of the placing table 60 (the electrostatic chuck) and the bottom surface of the substrate W through the through-hole 63, thereby effectively transferring the cold heat of the coolant or the refrigeration medium 80 to the substrate W.

In the example shown in FIG. 3, the coolant that has passed through a coolant supply channel 81 is supplied to the bottom surface of the substrate W through the through-hole 63. Further, the coolant discharged through the through-hole 63 flows through a coolant discharge channel 82 and is discharged. The supply and discharge of the coolant is not limited to the example shown in FIG. 3, and other types of coolant supply and discharge may be performed. For example, an independent coolant channel different from the coolant supply channel 81 and the coolant discharge channel 82 may be disposed at the through-hole 63, and the supply or discharge of the coolant through the through-hole 63 may be performed through the independent coolant channel.

A protrusion 62*a* that protrudes toward the refrigeration medium 80 side is formed on the bottom surface of the plate 62 constituting the placing table 60. The protrusion 62*a* of the illustrated example is an annular protrusion surrounding a central axis CL of the placing table 60. On the other hand, a recess 87 into which the protrusion 62*a* is loosely fitted is formed on the upper surface of the refrigeration medium 80, that is, on the surface facing the protrusion 62*a* of the placing table 60. The recess 87 of the illustrated example has an annular shape surrounding the central axis CL of the placing table 60.

The placing table 60 is supported by an outer cylinder 85. The outer cylinder 85 is disposed to cover the outer peripheral surface of the upper part of the refrigeration medium 80. The upper part of the outer cylinder 85 is inserted into the processing chamber 50 and supports the placing table 60 in the processing chamber 50. The outer cylinder 85 has a cylinder having an inner diameter slightly larger than the outer diameter of the refrigeration medium 80. The outer cylinder 85 directly supports the placing table 60. The outer cylinder 85 is made of metal such as stainless steel, for example.

The substrate processing apparatus 5 includes a substantially cylindrical bellows 51 at an outer side of the outer cylinder 85. The bellows 51 is a metal bellows structure that can be expanded and contracted in a vertical direction. The bellows 51 surrounds the outer cylinder 85, and separates the inner space of the processing chamber 50 that can be decompressed and an outer space of the processing chamber 50.

A refrigeration medium (also referred to as "cold link") 80 is fixed on a refrigerator (not shown). The refrigeration medium 80 and the refrigerator constitute a freezing device that cools the placing table 60 to an extremely low temperature of 200 K or lower. The refrigerator holds the refrigeration medium 80 and cools the upper surface of the refrigeration medium 80 to an extremely low temperature. In view of cooling performance, the refrigerator uses a Gifford-McMahon (GM) cycle. The upper part of the refrigeration medium 80 is accommodated in the processing chamber 50. The refrigeration medium 80 is made of copper (Cu) or the like having high thermal conductivity. The refrigeration medium 80 has a substantially cylindrical shape. The refrigeration medium 80 is disposed such that the center thereof coincides with the central axis CL of the placing table 60.

The refrigeration medium 80 has therein the coolant supply channel 81 for supplying a coolant (cooling gas) to the gap GAP between the refrigeration medium 80 and the placing table 60, and the coolant discharge channel 82 for discharging the coolant whose temperature has increased due to heat transfer from the placing table 60. The coolant supply channel 81 and the coolant discharge channel 82 are connected to a coolant supply device 71.

The coolant supplied from the coolant supply device 71 flows through the coolant supply channel 81 and is supplied to the gap GAP. On the other hand, the coolant discharged from the gap GAP flows through the coolant discharge channel 82 and is discharged to the coolant supply device 71. Alternatively, the coolant supply channel and the coolant discharge channel may be the same channel. Helium (He) gas having high thermal conductivity is suitably used as the coolant supplied to the gap GAP to cool the placing table 60.

The coolant supply device 71 is connected to the controller 4. The coolant supply device 71 supplies a coolant of a set temperature to the coolant supply channel 81. Further, the coolant supply device 71 collects the coolant returned from the coolant discharge channel 82, adjusts the coolant to the set temperature, and supplies the coolant from the coolant supply channel 81.

The placing table 60 includes the electrostatic chuck 65 and a temperature sensor 64. The temperature sensor 64 is connected to a temperature converter 73. The temperature converter 73 converts a signal from the temperature sensor into a temperature signal and outputs it to the controller 4. The controller 4 measures the temperature of the placing table 60 using the temperature sensor 64. The temperature sensor 64 is an example of a measurement device for measuring a temperature of the placing table 60.

<Substrate Processing Apparatus 6>

Figure 4:
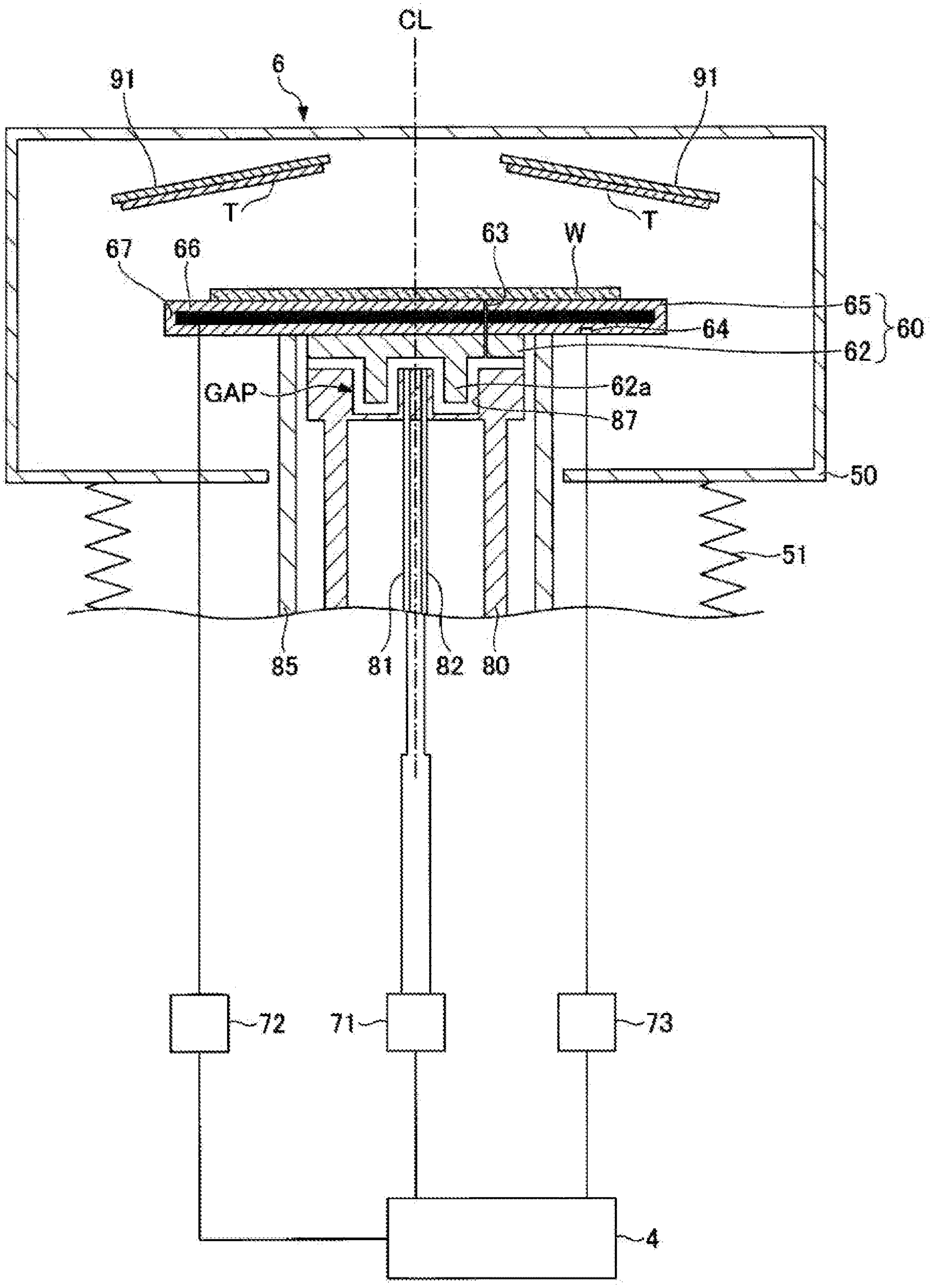
FIG. 4 is a schematic cross-sectional view of an example of the substrate processing apparatus of the semiconductor manufacturing apparatus according to the present embodiment.

Next, a substrate processing apparatus 6 used in any one of the process modules PM1 to PM10 will be described. FIG. 4 is a schematic cross-sectional view of a substrate processing apparatus 56 that is an example of the substrate processing apparatus of the semiconductor manufacturing apparatus according to the present embodiment. Here, the substrate processing apparatus 6 is an apparatus for forming an oxide semiconductor film of indium-gallium-zinc-oxide (IGZO) on a substrate W that has been cooled to an extremely low temperature of 200 K or lower.

The substrate processing apparatus 6 is a physical vapor deposition (PVD) apparatus for forming an oxide semiconductor film or the like on the substrate W such as a semiconductor wafer or the like, which is an object to be processed, in the processing chamber 50 where an ultra-high vacuum and extremely low temperature atmosphere is generated and substrate processing using a processing gas is performed. Here, the ultra-high vacuum refers to a pressure atmosphere of 10-5 Pa or lower, for example, and the extremely low temperature refers to a temperature atmosphere of 200 K or lower.

Similarly to the substrate processing apparatus 5 (see FIG. 3), the substrate processing apparatus 6 includes the processing chamber 50, the placing table 60 on which a substrate W is placed in the processing chamber 50, and the freezing device (the refrigeration medium 80 and the refrigerator).

In the processing chamber 50, multiple target holders 91 are fixed above the placing table 60. Different types of targets T are attached to the bottom surfaces of the target holders 91.

Further, the processing chamber 50 is configured such that the inside thereof is decompressed to an ultra-high vacuum by operating an exhaust device (not shown) such as a vacuum pump or the like. Further, a processing gas (for example, a noble gas such as argon (Ar), krypton (Kr), neon (Ne) or a nitrogen ($N_2$) gas) required for sputter film formation is supplied to the processing chamber 50 through gas supply lines (all not shown) communicating with a processing gas supply device.

An alternating current (AC) voltage or a direct current (DC) voltage is applied from a plasma generation power supply (not shown) to the target holders 91. When an AC voltage is applied from the plasma generation power supply to the target holders 91 and the targets T, plasma is generated in the processing chamber 50, the noble gas or the like in the processing chamber 50 is ionized, and the targets T are sputtered by the ionized noble gas element or the like. Atoms or molecules of the sputtered targets T are deposited on the surface of the substrate W that is held in the placing table 60 to face the targets T.

The substrate processing apparatus 6 includes a rotation device (not shown) for rotating the placing table 60, a first lifting device (not shown) for raising and lowering the placing table 60, and a second lifting device (not shown) for raising and lowering the freezing device (the refrigeration medium 80 and the refrigerator).

<Film Forming Method>

Figure 5:
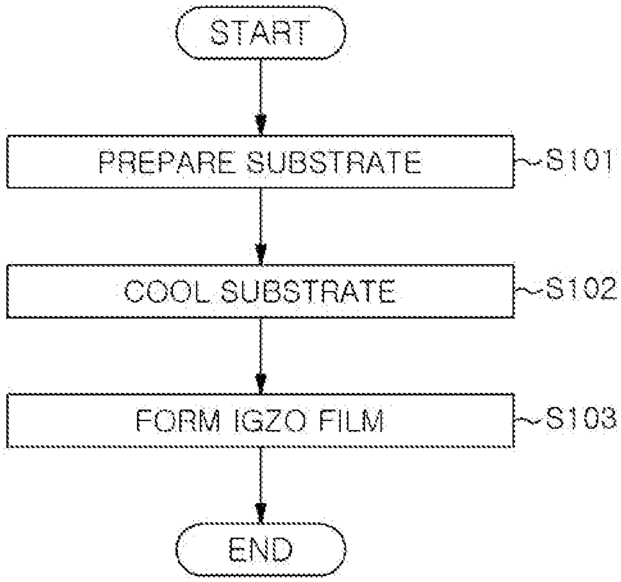
FIG. 5 is a flowchart illustrating an example of a film forming method according to the present embodiment.

Next, a film forming method according to the present embodiment will be described using FIG. 5. FIG. 5 is a flowchart illustrating an example of the film forming method according to the present embodiment. Here, a method for forming an oxide semiconductor film at the time of forming a thin film transistor (TFT) will be described.

In step S101, a substrate W on which a gate electrode and a gate dielectric film are formed is prepared. First, a gate electrode is formed on the substrate W in a gate electrode forming apparatus used in any one of the process modules PM1 to PM10 of the semiconductor manufacturing apparatus 1. Next, a gate dielectric film is formed on the gate electrode in a gate dielectric film forming apparatus used in any one of the process modules PM1 to PM10 of the semiconductor manufacturing apparatus 1. The substrate W on which the gate electrode and the gate dielectric film are formed is transferred to the substrate processing apparatus 5 (first chamber) shown in FIG. 3 and placed on the placing table 60 by any one of the transfer modules TM1 to TM5.

In step S102, the substrate W is cooled. Here, the substrate W placed on the placing table 60 is cooled to an extremely low temperature of 200 K or lower using the freezing device (the refrigeration medium 80 and the refrigerator).

The substrate W cooled to an extremely low temperature in step S102 is transferred to a film forming apparatus (second chamber) used in any one of the process modules PM1 to PM10 of the semiconductor manufacturing apparatus 1 by any one of the transfer modules TM1 to TM5.

In step S103, an oxide semiconductor film containing indium-gallium-zinc-oxide (IGZO) is formed on the substrate W cooled to an extremely low temperature of 200 K or lower. The film forming apparatus is, for example, a PVD apparatus. An oxide semiconductor film is formed by the film forming apparatus to which the substrate W is transferred.

Next, the substrate W on which the oxide semiconductor film is formed is transferred to any one of the process modules PM1 to PM10 of the semiconductor manufacturing apparatus 1 by any one of the transfer modules TM1 to TM5, and a source electrode, a drain electrode and the like are formed on the oxide semiconductor film, thereby forming a TFT on the substrate W. Further, the substrate W is transferred to any one of the process modules PM1 to PM10 of the semiconductor manufacturing apparatus 1 or to an annealing apparatus disposed outside the semiconductor manufacturing apparatus 1, and is subjected to post-annealing treatment. Accordingly, an amorphous oxide semiconductor film formed in step S103 is annealed.

Figure 6:
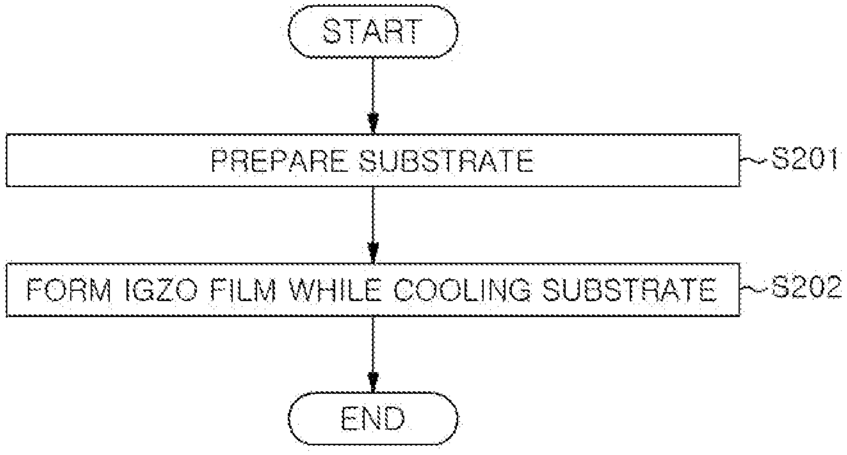
FIG. 6 is a flowchart showing another example of the film forming method according to the present embodiment.

Next, another film forming method according to the present embodiment will be described using FIG. 6. FIG. 6 is a flowchart showing another example of the film forming method according to the present embodiment. Here, a method for forming an oxide semiconductor film at the time of forming a TFT will be described.

In step S201, a substrate W on which a gate electrode and a gate dielectric film are formed is prepared. First, a gate electrode is formed on the substrate W in a gate electrode forming apparatus used in any one of the process modules PM1 to PM10 of the semiconductor manufacturing apparatus 1. Next, a gate dielectric film is formed on the gate electrode in a gate dielectric film forming apparatus used in any one of the process modules PM1 to PM10 of the semiconductor manufacturing apparatus 1. The substrate W on which the gate electrode and the gate dielectric film are formed is transferred to the substrate processing apparatus 6 (the second chamber) shown in FIG. 4 and placed on the placing table 60 by any one of the transfer modules TM1 to TM5.

In step S202, an oxide semiconductor film containing indium-gallium-zinc-oxide (IGZO) is formed on the substrate W while cooling the substrate W to an extremely low temperature of 200 K or lower. Here, the substrate W placed on the placing table 60 is cooled to an extremely low temperature of 200 K or lower using the freezing device (the refrigeration medium 80 and the refrigerator), and the targets T are sputtered to form an oxide semiconductor film on the surface of the substrate W held on the placing table 60.

Then, the substrate W on which the oxide semiconductor film is formed is transferred to any one of the process modules PM1 to PM10 of the semiconductor manufacturing apparatus 1 by any one of the transfer modules TM1 to TM5, and a source electrode, a drain electrode and the like are formed on the oxide semiconductor film, thereby forming a TFT on the substrate W. The substrate W is transferred to any one of the process modules PM1 to PM10 of the semiconductor manufacturing apparatus 1 or to an annealing apparatus disposed outside the semiconductor manufacturing apparatus 1, and is subjected to post-annealing treatment. Accordingly, the amorphous oxide semiconductor film formed in step S202 is annealed.

In the flow shown in FIG. 5, the case where the cooling of the substrate W in step S102 and the formation of the oxide semiconductor film in step S103 are performed in different chambers has been described. However, the present disclosure is not limited thereto. For example, the cooling of the substrate W in step S102 and the formation of the oxide semiconductor film in step S103 may be performed in the same chamber using the substrate processing apparatus 6 (see FIG. 4).

For example, in step S102, the freezing device (the refrigeration medium 80 and the refrigerator) is raised using a second lifting device (not shown), and the plate 62 and the refrigeration medium 80 are thermally connected to cool the substrate W placed on the placing table 60.

Then, in step S103, the freezing device (the refrigeration medium 80 and the refrigerator) is lowered using the second lifting device (not shown) to release the connection between the plate 62 and the refrigeration medium 80, and the sputtering is performed while rotating the placing table 60 using the rotation device (not shown), thereby forming an oxide semiconductor film on the substrate W.

<TFT>

Figure 7A:
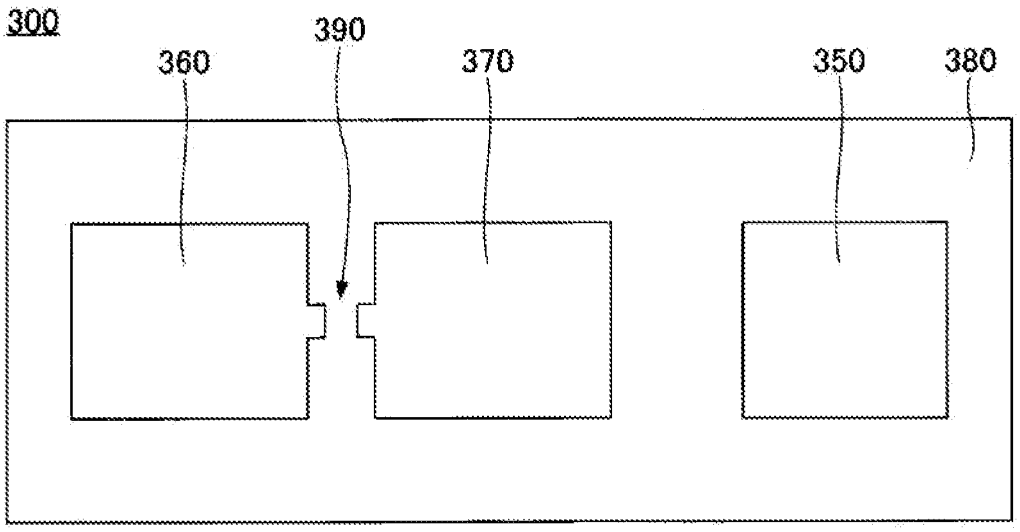
FIG. 7A is a plan view showing an example of a TFT according to an embodiment.
Figure 7B:
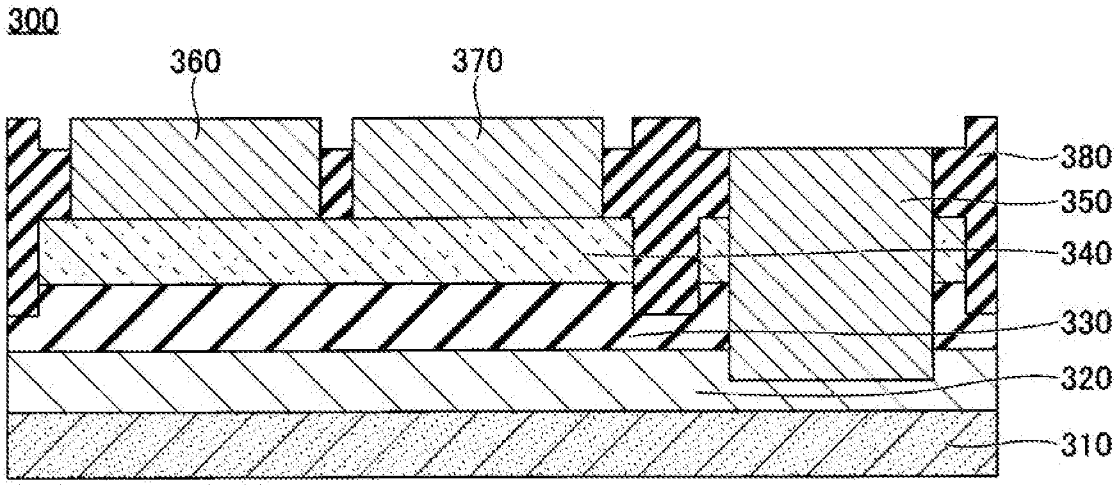
FIG. 7B is a cross-sectional view showing an example of the TFT according to an embodiment.

Next, an example of a TFT 300 including an oxide semiconductor film 340 will be described with reference to FIGS. 7A and 7B. FIGS. 7A and 7B show an example of the TFT 300 according to an embodiment. FIG. 7A shows a plan view of the TFT 300, and FIG. 7B shows a cross-sectional view of the TFT 300.

The TFT 300 includes a substrate 310, a gate electrode 320, a gate dielectric film 330, an oxide semiconductor film 340, a gate electrode 350, a drain electrode 360, a source electrode 370, and an insulating film 380.

The substrate 310 is formed by nitriding a silicon substrate, for example.

The gate electrode 320 is a conductive film formed on the substrate 310. The gate electrode 320 is made of TiN, for example.

The gate dielectric film 330 is a dielectric film formed on the gate electrode 320. The gate dielectric film 330 is formed by stacking SiCN and AlO, for example.

The oxide semiconductor film 340 is an oxide semiconductor film formed on the gate dielectric film 330. The oxide semiconductor film 340 is made of indium-gallium-zinc-oxide (IGZO). In the TFT 300 of the present embodiment, the oxide semiconductor film 340 is formed at an extremely low temperature as shown in the flowcharts of FIGS. 5 and 6.

The gate electrode 350 is formed to be connected to the gate electrode 320. The drain electrode 360 and the source electrode 370 are formed on the oxide semiconductor film 340. Further, the drain electrode 360 and the source electrode 370 are spaced apart from each other to form a channel 390 between the drain electrode 360 and the source electrode 370. The gate electrode 350, the drain electrode 360, and the source electrode 370 are made of TiN or W, for example.

The insulating film 380 is an insulating film formed on the oxide semiconductor film 340. The insulating film 380 is made of SiO, for example. The gate electrode 350, the drain electrode 360 and the source electrode 370 are formed such that the upper ends thereof are exposed from the upper surface of the insulating film 380.

<I-V Characteristics of TFT>

Next, the I-V characteristics of the TFT 300 will be described with reference to FIGS. 8 and 9.

First, the I-V characteristics of the TFT 300 in which the oxide semiconductor film 340 is formed by a film forming method according to a reference example will be described with reference to FIG. 8. FIG. 8 is an example of a graph showing the I-V characteristics of the TFT 300 in which the oxide semiconductor film 340 is formed by the film forming method according to the reference example. The horizontal axis represents a gate voltage Vg, and the vertical axis represents a drain current Id.

Figure 8:
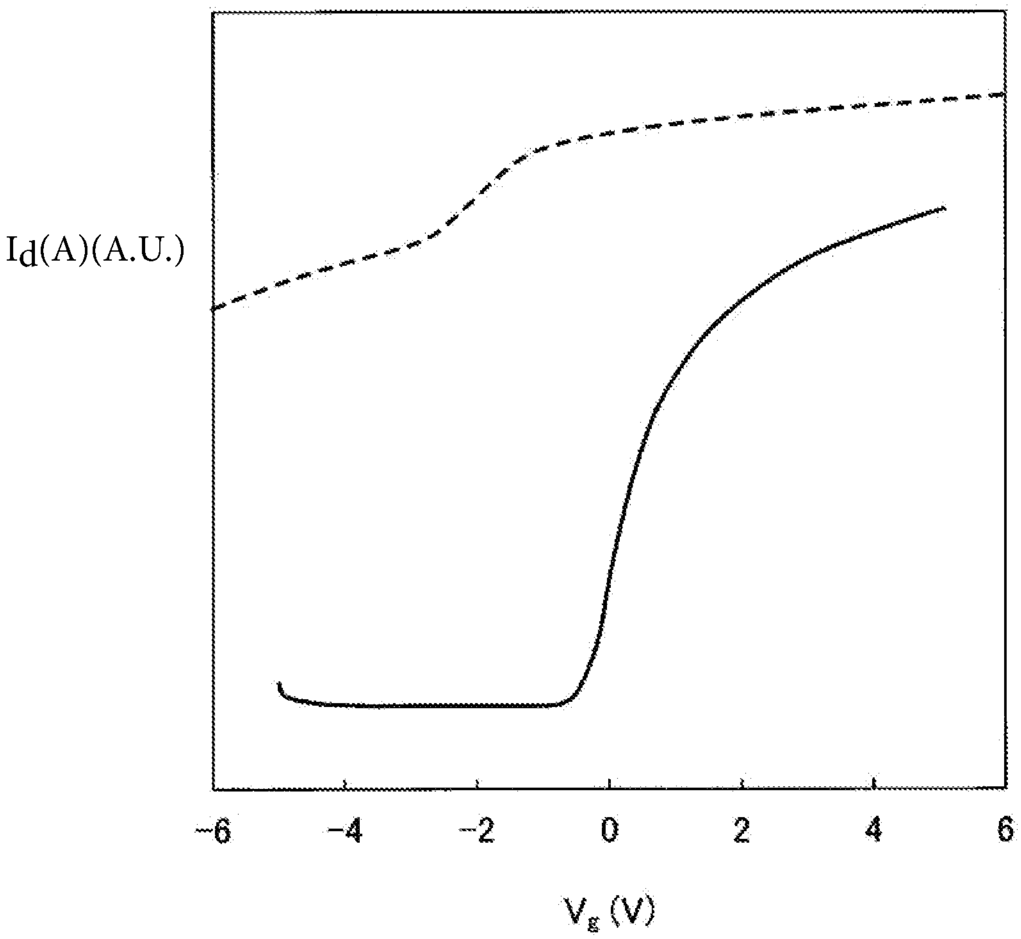
FIG. 8 is an example of a graph showing I-V characteristics of a TFT in which an oxide semiconductor film is formed by a film forming method according to a reference example.

Further, in the TFT 300 according to the reference example shown in FIG. 8, the oxide semiconductor film 340 was formed at normal temperature (room temperature). Further, in the TFT 300 according to the reference example shown in FIG. 8, the substrate W was subjected to annealing after the formation of the TFT 300. The I-V characteristics of the TFT 300 according to the reference example before the annealing are indicated by a dashed line, and the I-V characteristics of the TFT 300 according to the reference example after the annealing is indicated by a solid line.

In the I-V characteristics of the TFT 300 before the annealing (dashed line), the threshold voltage is shifted to a negative side due to the influence of oxygen vacancies in the oxide semiconductor film 340. On the other hand, in the I-V characteristics of the TFT 300 after the annealing (solid line), the threshold voltage can be shifted to a positive side compared to that before the annealing. However, even in the TFT 300 after the annealing, the drain current Id occurs when the gate voltage Vg is 0V, and the TFT 300 is in an ON state.

Therefore, in the TFT 300 according to the reference example, leakage current occurs when the gate voltage Vg is 0V. Alternatively, in the TFT 300 according to the reference example, it is necessary to apply an offset voltage for turning off the TFT 300 to the gate voltage Vg.

Figure 9:
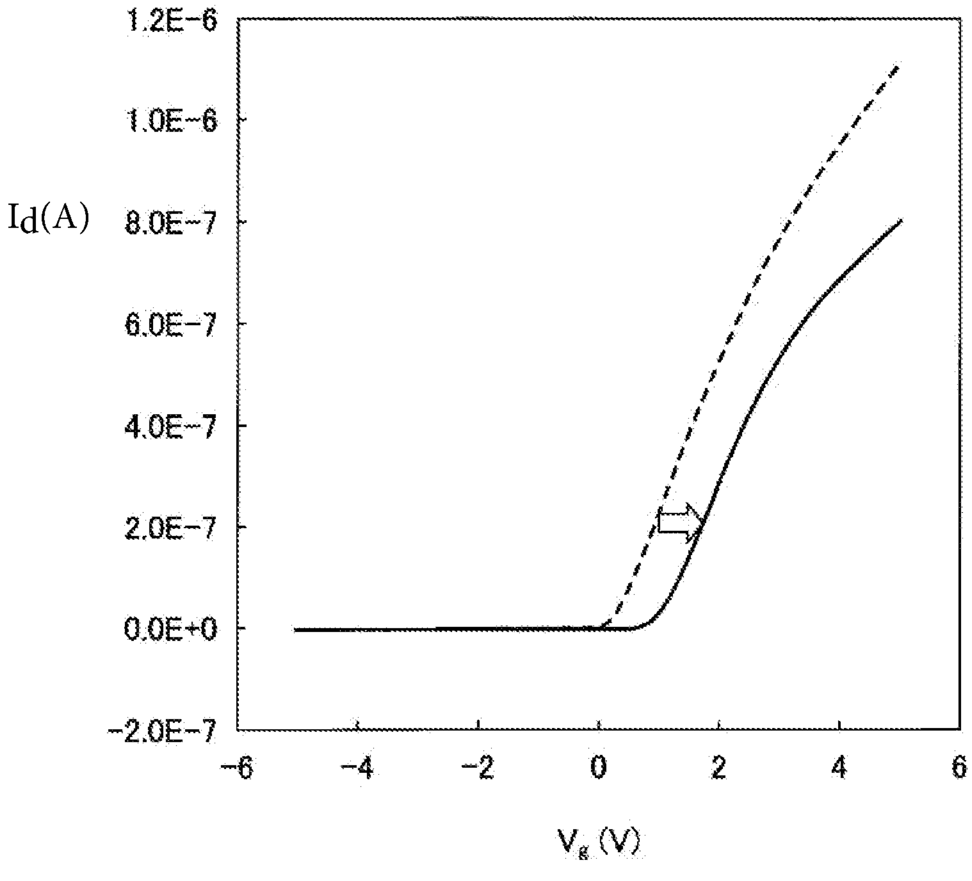
FIG. 9 is an example of a graph showing I-V characteristics of a TFT in which an oxide semiconductor film is formed by the film forming method according to the present embodiment and a TFT in which an oxide semiconductor film is formed by the film forming method according to the reference example.

Next, the I-V characteristics of the TFT 300 in which the oxide semiconductor film 340 is formed by the film forming method according to the present embodiment will be compared with those in the reference example with reference to FIG. 9. FIG. 9 is an example of a graph showing the I-V characteristics of the TFT 300 in which the oxide semiconductor film 340 is formed by the film forming method according to the present embodiment and the TFT 300 in which the oxide semiconductor film 340 is formed by the film forming method according to the reference example. The horizontal axis represents the gate voltage Vg, and the vertical axis represents the drain current Id.

Further, in the TFT 300 according to the present embodiment shown in FIG. 9, the oxide semiconductor film 340 was formed at an extremely low temperature of 100 K, and the substrate W was annealed after the formation of the TFT 300. Further, in the TFT 300 according to the reference example shown in FIG. 9, the oxide semiconductor film 340 was formed at normal temperature (room temperature), and the substrate W was annealed after the formation of the TFT 300. The I-V characteristics of the TFT 300 according to the reference example after the annealing are indicated by a dashed line, and the I-V characteristics of the TFT 300 according to the present embodiment after the annealing are indicated by a solid line.

In the film forming method according to the present embodiment, the oxide semiconductor film 340 is formed at an extremely low temperature of 200 K or lower. Accordingly, when the oxide semiconductor film 340 is formed on the substrate W by sputtering, it is possible to reduce oxygen vacancies in the oxide semiconductor film 340 by suppressing the escape of oxygen atoms (O) from the oxide semiconductor film 340. Therefore, as shown in FIG. 9, in the TFT 300 according to the present embodiment after the annealing (see solid line), the threshold voltage can be shifted to the positive side compared to that in the TFT 300 according to the reference example after the annealing (see dashed line).

Further, in the TFT 300 according to the present embodiment after the annealing, it is possible to prevent the leakage current (drain current Id) from being generated when the gate voltage Vg is 0V. In other words, the TFT 300 according to the present embodiment can be a normally-off TFT. Further, in the TFT 300 according to the present embodiment, it is unnecessary to apply an offset voltage.

It is preferable that the oxide semiconductor film 340 is formed at an extremely low temperature of 200 K or lower. Accordingly, oxygen vacancies in the oxide semiconductor film 340 can be suppressed. Further, it is more preferable that the oxide semiconductor film 340 is formed at 100 K or higher and 150 K or lower. Hence, oxygen vacancies in the oxide semiconductor film 340 can be further suppressed.

While the embodiments of the film forming method and the substrate processing apparatus have been described, the film forming method and the substrate processing apparatus of the present disclosure are not limited to the above-described embodiments, and may be variously modified and improved within the scope of the present disclosure. The above-described embodiment may be combined without contradicting each other.

This application claims priority to Japanese Patent Application No. 2021-96878, filed on Jun. 9, 2021, the entire contents of which are incorporated herein by reference.

DESCRIPTION OF REFERENCE NUMERALS

1: Semiconductor manufacturing apparatus (substrate processing apparatus)
4: controller
5: substrate processing apparatus
6: substrate processing apparatus
50: processing chamber
60: placing table
80: refrigeration medium
91: target holder
310: substrate
320: gate electrode
330: gate dielectric film
340: oxide semiconductor film
350: gate electrode
360: drain electrode
370: source electrode
380: insulating film
390: channel
T: target
W: substrate
PM1 to PM10: process module

The invention claimed is:

1. A film forming method comprising:

cooling a substrate having a gate electrode and a gate dielectric film formed on the gate electrode to an extremely low temperature of 100 K or higher and 150 K or lower;

forming an oxide semiconductor film on the gate dielectric film of the cooled substrate;

forming a drain electrode and a source electrode on the oxide semiconductor film, to form a thin film transistor on the substrate; and performing an annealing treatment on the substrate, wherein the thin film transistor after the annealing treatment is a normally-off thin film transistor.

2. The film forming method of claim 1, wherein said cooling the substrate to the extremely low temperature is executed in a first chamber for cooling the substrate, and said forming the oxide semiconductor film on the cooled substrate is executed in a second chamber for forming the oxide semiconductor film on the cooled substrate.

3. The film forming method of claim 1, wherein said cooling the substrate to the extremely low temperature and said forming the oxide semiconductor film on the cooled substrate are executed in a same chamber.

4. The film forming method of claim 1, wherein the oxide semiconductor film is an indium-gallium-zinc-oxide film.

* * * * *